US010490388B2

(12) United States Patent
Nanao

(10) Patent No.: US 10,490,388 B2
(45) Date of Patent: Nov. 26, 2019

(54) MULTIBEAM-FOCUS ADJUSTING METHOD, MULTIBEAM-FOCUS MEASURING METHOD, AND CHARGED-PARTICLE-BEAM LITHOGRAPHY APPARATUS

(71) Applicant: NUFLARE TECHNOLOGY, INC., Yokohama-shi (JP)

(72) Inventor: Tsubasa Nanao, Yokohama (JP)

(73) Assignee: NUFLARE TECHNOLOGY, INC., Yokohama-shi (JP)

( * ) Notice: Subject to any disclaimer, the term of this patent is extended or adjusted under 35 U.S.C. 154(b) by 0 days.

(21) Appl. No.: 15/785,893

(22) Filed: Oct. 17, 2017

(65) Prior Publication Data

US 2018/0108511 A1 Apr. 19, 2018

(30) Foreign Application Priority Data

Oct. 18, 2016 (JP) .................................. 2016-204503

(51) Int. Cl.
*H01J 37/21* (2006.01)
*H01J 37/317* (2006.01)

(52) U.S. Cl.
CPC .......... *H01J 37/21* (2013.01); *H01J 37/3177* (2013.01); *H01J 2237/216* (2013.01)

(58) Field of Classification Search
USPC ....................................................... 250/397
See application file for complete search history.

(56) References Cited

U.S. PATENT DOCUMENTS

| | | | | |
|---|---|---|---|---|
| 5,404,012 A | * | 4/1995 | Yamada | H01J 37/21 250/310 |
| 6,768,125 B2 | * | 7/2004 | Platzgummer | B82Y 10/00 250/492.1 |
| 6,784,442 B2 | * | 8/2004 | Muraki | B82Y 10/00 250/396 ML |

(Continued)

FOREIGN PATENT DOCUMENTS

| | | |
|---|---|---|
| JP | 6-243812 A | 9/1994 |
| JP | 10-172895 | 6/1998 |

(Continued)

OTHER PUBLICATIONS

Office Action dated Jan. 11, 2019 in Korean Patent Application No. 10-2017-0124376, 10 pages (with unedited computer generated English translation).

*Primary Examiner* — Phillip A Johnston
(74) *Attorney, Agent, or Firm* — Oblon, McClelland, Maier & Neustadt, L.L.P.

(57) ABSTRACT

A multibeam-focus adjusting method in a charged-particle-beam lithography apparatus that draws a pattern by irradiating a sample with multibeams having a plurality of beam lines through a plurality of lines of opening portions provided on an aperture member, the method adjusting a focus of the multibeams and including: acquiring a rotation angle of the beam lines with respect to an end edge of a mark provided at a predetermined position; determining selection beams to be used for adjustment among the multibeams based on the acquired rotation angle; and adjusting a focus of the multibeams based on reflected electrons acquired by irradiating the mark with the selection beams and scanning the mark in a direction orthogonal to the end edge of the mark.

14 Claims, 8 Drawing Sheets

(56) References Cited

U.S. PATENT DOCUMENTS

| | | | | |
|---|---|---|---|---|
| 6,943,349 B2* | 9/2005 | Adamec | ................. | H01J 37/04 |
| | | | | 250/306 |
| 9,082,581 B2* | 7/2015 | Matsumoto | ........... | H01J 37/147 |
| 2013/0344443 A1* | 12/2013 | Kawamoto | ......... | H01J 37/3174 |
| | | | | 430/296 |

FOREIGN PATENT DOCUMENTS

| JP | 2002-110532 | 4/2002 |
|---|---|---|
| JP | 2003-203836 A | 7/2003 |
| JP | 2007-206407 | 8/2007 |
| JP | 2009-111405 A | 5/2009 |
| JP | 2014-127568 | 7/2014 |

\* cited by examiner

MULTIBEAM-FOCUS ADJUSTING METHOD, MULTIBEAM-FOCUS MEASURING METHOD, AND CHARGED-PARTICLE-BEAM LITHOGRAPHY APPARATUS

CROSS-REFERENCE TO RELATED APPLICATIONS

This application is based upon and claims the benefit of priority from Japanese Patent Application No. 2016-204503, filed on Oct. 18, 2016, the entire contents of which are incorporated herein by reference.

FIELD

The embodiments of the present invention relate to a multibeam-focus adjusting method, a multibeam-focus measuring method, and a charged-particle-beam lithography apparatus.

BACKGROUND

A charged-particle-beam lithography apparatus that draws a pattern on a sample by irradiating the sample on a stage with charged particle beams conventionally adjusts the focus of the charged particle beams on a sample face to draw the pattern.

To adjust the focus, a mark provided on the sample face is scanned with the charged particle beams to acquire a signal of reflected electrons while excitation amounts of an objective lens are allocated, and an excitation amount at a time when the rising of the waveform of the signal becomes sharpest is set to the objective lens as a focus during drawing.

In recent years, a charged-particle-beam lithography apparatus of a multibeam system that draws a pattern on a sample using multibeams is adopted from a viewpoint of improving the throughput, or the like.

SUMMARY

During focus adjustment, the charged-particle-beam lithography apparatus of the multibeam system scans a mark with multibeams in a direction orthogonal to an end edge of the mark and acquires a signal of reflected electrons of a plurality of beams with respect to each beam line.

However, when the beam lines are inclined, that is, rotated with respect to the end edge of the mark during scanning, an overlap between forward and backward beam lines that are adjacent in the scan direction occurs where irradiation start periods for the mark, that is, detection start periods for the reflected electrons partially overlap with each other. For example, when irradiation of the mark with one beam in the forward beam line located at the tail end in the scan direction due to rotation is started, irradiation of the mark with one beam in the backward beam line located at the head in the scan direction due to the rotation is also started.

When such an overlap occurs, the waveform of a signal of reflected electrons is rounded and this rounding cannot be distinguished from rounding caused by defocusing. Therefore, there is conventionally a problem that appropriate focus adjustment is difficult when rotation of the beam lines with respect to the end edge of the mark occurs.

An object of the present invention is to provide a multibeam-focus adjusting method, a multibeam-focus measuring method, and a charged-particle-beam lithography apparatus that can appropriately adjust the focus of multibeams.

A multibeam-focus adjusting method according to an aspect of the present invention is a multibeam-focus adjusting method in a charged-particle-beam lithography apparatus that draws a pattern by irradiating a sample with multibeams having a plurality of beam lines through a plurality of lines of opening portions provided on an aperture member, the method adjusts a focus of the multibeams and comprises:

acquiring a rotation angle of the beam lines with respect to an end edge of a mark provided at a predetermined position;

determining selection beams to be used for adjustment among the multibeams based on the acquired rotation angle; and adjusting a focus of the multibeams based on reflected electrons acquired by irradiating the mark with the selection beams and scanning the mark in a direction orthogonal to the end edge of the mark.

In the multibeam-focus adjusting method described above, the selection beams may be beam lines obtained by thinning the beam lines by number of beams to be thinned, the number being obtained based on the rotation angle.

In the multibeam-focus adjusting method described above, the selection beams may be number of beams among a plurality of beams in the beam lines, the number being determined based on the rotation angle.

In the multibeam-focus adjusting method described above, the number of beams to be thinned may meet a following formula (1):

$$m \geq \frac{\{p(N-1)+s\}\tan\theta - (p-s)}{p} \quad (1)$$

where m is number of beams to be thinned, p is a beam pitch of multibeams, s is a beam size, θ is a rotation angle of the beam lines, and N is number of beams per beam line in formula (1).

In the multibeam-focus adjusting method described above, determination of the selection beams may comprise increasing a value of N in a range where m has a negative value, instead of thinning beams, when m has a negative value.

In the multibeam-focus adjusting method described above, adjustment of the focus may comprise:

setting a plurality of excitation amounts to an objective lens;

acquiring the reflected electrons by scanning the mark with the selection beams in each of the set excitation amounts; and setting an excitation amount providing a largest slope of a signal waveform of the reflected electrons among the excitation amounts as a focus of the multibeams.

In the multibeam-focus adjusting method described above, the signal waveform of the reflected electrons may be a stepped waveform indicating a signal amount increasing in a stepped manner as time passes.

In the multibeam-focus adjusting method described above, a slope of the signal waveform may be an average value of slopes of the signal waveform at a plurality of positions.

A multibeam-focus measuring method according to another aspect of the present invention is a multibeam-focus measuring method in a charged-particle-beam lithography apparatus that draws a pattern by irradiating a sample with multibeams having a plurality of beam lines through a plurality of lines of opening portions provided on an aperture member, the method measures a focus of the multibeams and comprises:

acquiring a rotation angle formed by beam lines of multibeams irradiated through some opening portion groups among the lines of opening portions with respect to an end edge of the mark provided at a predetermined position;

determining selection beams to be used for measurement among the multibeams based on the acquired rotation angle; and measuring a focus of the multibeams based on reflected electrons acquired by irradiating the mark with the determined beams and scanning the mark in a direction orthogonal to the end edge of the mark.

In the multibeam-focus measuring method described above, the lines of opening portions may be divided into a plurality of opening portion groups and a focus of the multibeams may be measured with respect to each of the opening portion groups to acquire a field curvature.

A charged-particle-beam lithography apparatus according to still another aspect of the present invention is a charged-particle-beam lithography apparatus that draws a pattern by irradiating a sample with multibeams having a plurality of beam lines through a plurality of lines of opening portions provided on an aperture member, the apparatus comprises a controller adjusting a focus of the multibeams, wherein the controller acquires a rotation angle of the beam lines with respect to an end edge of a mark provided at a predetermined position, determines selection beams to be used for adjustment among the multibeams based on the acquired rotation angle, and adjusts a focus of the multibeams based on reflected electrons acquired by irradiating the mark with the selection beams and scanning the mark in a direction orthogonal to the end edge of the mark.

According to the present invention, it is possible to appropriately adjust the focus of multibeams.

DETAILED DESCRIPTION

Embodiments of the present invention will now be explained with reference to the accompanying drawings. The present invention is not limited to the embodiments.

First Embodiment

Figure 1:
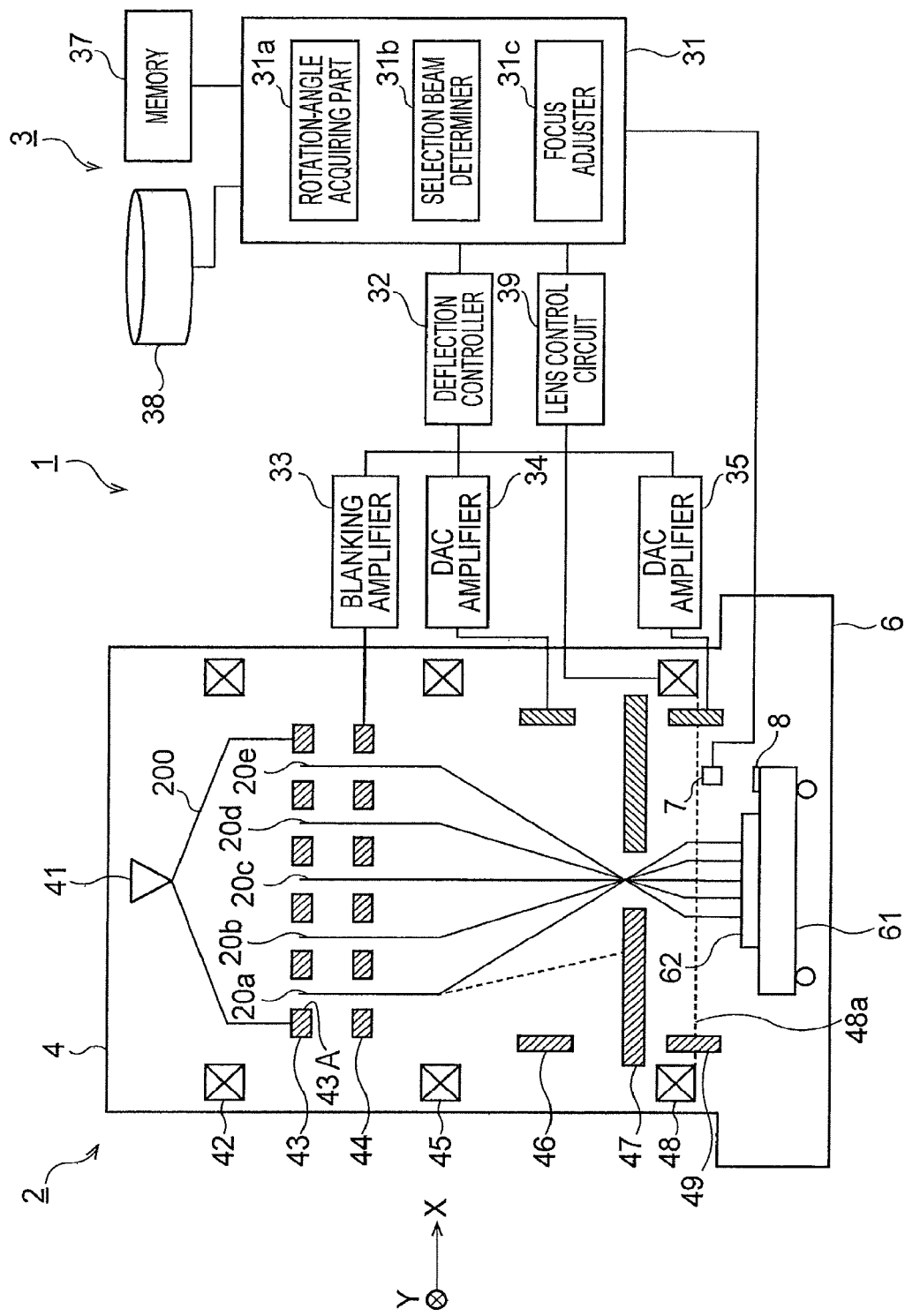
FIG. 1 is a block diagram illustrating a charged-particle-beam lithography apparatus of a multibeam system, which is applicable to a focus adjusting method according to a first embodiment.

FIG. 1 is a block diagram illustrating a charged-particle-beam lithography apparatus 1 of a multibeam system, which is applicable to a focus adjusting method according to a first embodiment. In the following embodiments, a configuration using electron beams is explained as an example of charged particle beams. However, the charged particle beams are not limited to the electron beams and can be beams using charged particles other than the electron beams, such as ion beams.

The charged-particle-beam lithography apparatus 1 is an example of a charged-particle-beam lithography apparatus that draws a pattern by irradiating a sample with multibeams having a plurality of beam lines through a plurality of lines of opening portions provided on an aperture member. As illustrated in FIG. 1, the charged-particle-beam lithography apparatus 1 generally includes a lithography part 2 and a controller 3.

The lithography part 2 includes an electron column 4 and a lithography chamber 6. An electron gun 41 is arranged in the electron column 4. An illuminating lens 42, an aperture member 43, a blanking plate 44, a reducing glass 45, first deflectors 46, a limiting aperture member 47, an objective lens 48, and second deflectors 49 are also arranged in the electron column 4 in this order along an optical path of electron beams 200 irradiated from the electron gun 41.

Configurations of the aperture member 43 and the blanking plate 44 are explained in more detail below.

Figure 2:
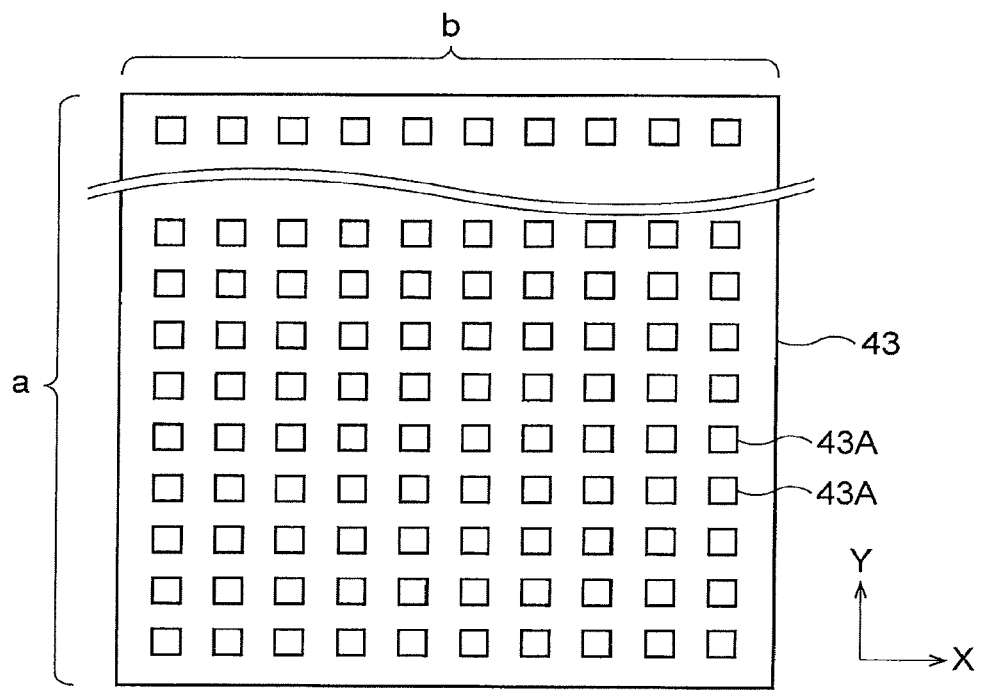
FIG. 2 illustrates an aperture member applicable to the multibeam-focus adjusting method according to the first embodiment.

FIG. 2 illustrates the aperture member 43 applicable to the multibeam-focus adjusting method according to the first embodiment. As illustrated in FIG. 2, opening portions 43A are formed on the aperture member 43 including "a" rows arrayed in the vertical direction (a Y direction) and b columns arrayed in the horizontal direction (an X direction) (a, b≥2) at a predetermined array pitch in a matrix. In FIG. 2, for example, 10 columns each including 512 opening portions 43A are formed. The opening portions 43A are formed in a rectangular shape with the same size and shape. An example where 10 columns of the opening portions 43A, in each of which a plurality of opening portions 43A are arrayed in the Y direction, are formed in the X direction is illustrated here. The shape of the opening portions 43A is not limited to a rectangle and can be, for example, a circle.

On this aperture member 43, the opening portions 43A are entirely irradiated with the electron beams 200 from the electron gun 41 and some of the electron beams 200 pass through a plurality of the opening portions 43A to form multibeams 20. While the multibeams 20 having five beams 20a to 20e are illustrated in FIG. 1, the actual multibeams 20 have a plurality of beam lines 201 (see FIGS. 5 and 6A).

Figure 3:
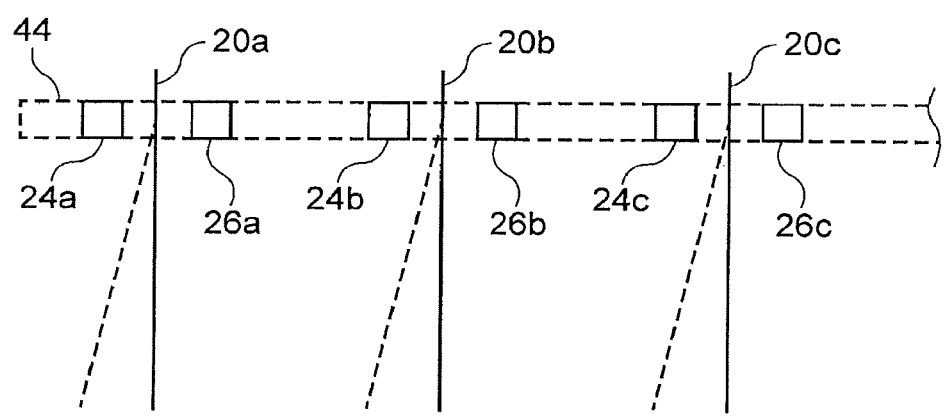
FIG. 3 is a sectional view illustrating a blanking plate applicable to the multibeam-focus adjusting method according to the first embodiment.

FIG. 3 is a sectional view illustrating the blanking plate 44 applicable to the multibeam-focus adjusting method according to the first embodiment. Passing holes are formed on the blanking plate 44 to correspond to the arrangement positions of the opening portions 43A of the aperture member 43. A pair of two electrodes 24 and 26, that is, a blanker is arranged at each of the passing holes. FIG. 3 representatively illustrates only three pairs of electrodes 24a to 24c and electrodes 26a to 26c.

The multibeams 20 passing through the passing holes are deflected by voltages applied to the corresponding blankers 24 and 26, respectively. In this manner, the blankers 24 and 26 perform blanking deflection of the corresponding beams among the multibeams 20 having passed through the opening portions 43A of the aperture member 43.

As illustrated in FIG. 1, a detector 7 is provided on a lower surface 48a of the objective lens 48. At the time of focus adjustment of the multibeams 20, the detector 7 detects reflected electrons in response to incidence of the multibeams 20 from a mark 8 provided on an XY stage 61, which will be explained later, and outputs an electric signal corresponding to the detection amount of the reflected electrons. The detector 7 is, for example, an SSD (Solid-State Detector, Si (Li) semiconductor detector). The detector 7 is not limited to the SSD and can be, for example, a semiconductor detector other than the SSD as long as the detector 7 can detect the reflected electrons. The position of the detector 7 can be any position other than the lower surface 48a of the objective lens 48 as long as the detector 7 can detect the reflected electrons from the mark 8.

The XY stage 61 is arranged in the lithography chamber 6. A sample 62, such as a reticle, being a lithography target is arranged on the XY stage 61. The mark 8 is provided on the XY stage 61 as an example of a predetermined position to be preferably located at the same height position as that of the sample 62. The mark 8 is, for example, a film of heavy metal formed in a rectangular shape. The mark 8 can be a material other than heavy metal as long as the mark 8 can emit reflected electrons in response to incidence of the multibeams 20. The sample 62 can include an exposure reticle used when a semiconductor device is manufactured, or a semiconductor substrate such as a silicon wafer on which a semiconductor device is manufactured. The sample 62 can include mask blanks on which a resist is coated and no pattern has not been drawn yet.

The first deflectors 46 and the second deflectors 49 are constituted of a plurality of electrodes with four poles or eight poles, for example. While only one DAC (Digital to Analog Converter) amplifier 34 and one DAC amplifier 35 corresponding to the first deflectors 46 and the second deflectors 49, respectively, are illustrated in FIG. 1, at least one DAC amplifier is practically connected to each electrode.

The controller 3 includes a control computer 31 (controller), a deflection controller 32, a blanking amplifier 33, deflection amplifiers (DAC amplifiers) 34 and 35, a memory 37, a storage device 38 such as a magnetic disk device, and a lens control circuit 39.

The control computer 31, the deflection controller 32, the memory 37, and the storage device 38 are connected to each other via a bus (not illustrated). The deflection controller 32, the blanking amplifiers 33, and the DAC amplifiers 34 and 35 are connected to each other via a bus (not illustrated). The lens control circuit 39 is connected between the control computer 31 and the objective lens 48.

The control computer 31 includes a rotation-angle acquiring part 31a, a selection beam determiner 31b, and a focus adjuster 31c.

The rotation-angle acquiring part 31a acquires a rotation angle of the beam lines 201 of the multibeams 20 with respect to an end edge 8a (see FIGS. 5 and 6A) of the mark 8 provided on the XY stage 61 to adjust the focus of the multibeams 20. The end edge 8a of the mark 8 is an end edge orthogonal to the scan direction for the mark 8, which will be explained later. A specific example of the acquiring method of the rotation angle will be explained in association with the multibeam-focus adjusting method described later.

The selection beam determiner 31b determines the number of beams in the multibeams 20 based on the rotation angle acquired by the rotation-angle acquiring part 31a. Determination of the number of beams can include determination of the number of beam lines 201 to be thinned. The determination of the number of beams also can include determination of the number of beams in each beam line 201. Another specific example of the determination method of the number of beams will be explained in association with the multibeam-focus adjusting method described later.

The focus adjuster 31c executes control to scan the mark 8 with the multibeams 20 including the number of beams determined by the selection beam determiner 31b in a direction orthogonal to the end edge 8a of the mark 8 (for example, in the X direction in FIG. 1) sequentially with each of the beam lines 201. The focus adjuster 31c adjusts the focus of the multibeams 20 based on reflected electrons acquired by the detector 7 in scanning of the mark 8. More specifically, to adjust the focus, the focus adjuster 31c sets a plurality of excitation amounts sequentially to the objective lens 48 via the lens control circuit 39 that sets an excitation amount to the objective lens 48. The focus adjuster 31c acquires reflected electrons by scanning the mark 8 with the multibeams 20 including the number of beams determined by the selection beam determiner 31b in each of the set excitation amounts. The focus adjuster 31c sets an excitation amount of a time when the slope of the signal waveform of an electric signal corresponding to the reflected electrons becomes largest among the excitation amounts as the focus of the multibeams 20, that is, the excitation amount at the time of pattern lithography. The excitation amount can be also set to the storage device 38.

The rotation-angle acquiring part 31a, the selection beam determiner 31b, and the focus adjuster 31c can be constituted of software, hardware, or both thereof. When the respective parts 31a to 31c are configured to include software, input data to the control computer 31 or a computing result thereof can be stored in the memory 37 each time it occurs.

With the rotation-angle acquiring part 31a, the selection beam determiner 31b, and the focus adjuster 31c, rounding of the signal waveform of the reflected electrons can be suppressed and the focus of the multibeams 20 can be appropriately adjusted even when rotational displacement occurs in the beam lines 201.

The blanking amplifier 33 is connected to the blanking plate 44. The DAC amplifier 34 is connected to the first deflectors 46. The DAC amplifier 35 is connected to the second deflectors 49. Independent controlling digital signals are output from the deflection controller 32 to the blanking amplifier 33 and the DAC amplifiers 34 and 35, respectively.

The blanking amplifier 33 and the DAC amplifiers 34 and 35 having received the digital signals convert the digital signals into analog voltage signals, amplify the voltage signals to obtain deflection signals, and output the deflection signals to the corresponding deflectors, respectively. In this manner, deflection voltages are applied to the deflectors from the DAC amplifiers connected thereto, respectively. The electron beams are deflected by these deflection voltages.

In the charged-particle-beam lithography apparatus 1, as described above, four poles or eight poles of the first deflectors 46 and the second deflectors 49 are provided to surround the electron beams and each pair (two pairs in the case of four poles and four pairs in the case of eight poles) of the first and second deflectors 46 and 49 is arranged to sandwich the electron beams. One DAC amplifier is connected to each of the first deflectors 46 and the second deflectors 49. However, only one DAC amplifier connected to the first deflectors 46 and one DAC amplifier connected to the second deflectors 49 are illustrated in FIG. 1 and illustrations of other DAC amplifiers are omitted.

Lithography data is input from outside to the storage device 38 and is stored therein. An optimum excitation amount of the objective lens 48 can be stored as the focus of the multibeams in the storage device 38.

A lithography operation of the charged-particle-beam lithography apparatus 1 is explained next. The electron beams 200 emitted from the electron gun 41 illuminate the entire aperture member 43 substantially vertically using the illuminating lens 42. The electron beams 200 illuminate a region including the opening portions 43A through the opening portions 43A provided on the aperture member 43.

Ones of the electron beams 200 irradiated to the positions of the opening portions 43A pass through the opening portions 43A, respectively. Accordingly, for example, the multibeams 20 including the electron beams 20a to 20e in a rectangular shape are formed. The electron beams 20a to 20e pass through between the corresponding blankers 24 and 26 in the blanking plate 44, respectively. The blankers 24 and 26 perform blanking deflection to individually deflect the multibeams 20.

The multibeams 20 having passed through the blanking plate 44 are reduced by the reducing lens 45 and then travel toward a hole formed at the center of the limiting aperture member 47. At that time, the multibeams 20 deflected by the blankers 24 and 26 of the blanking plate 44 are out of the position of the hole at the center of the limiting aperture member 47 and are shielded by the limiting aperture member 47.

On the other hand, the multibeams 20 not deflected by the blankers 24 and 26 of the blanking plate 44 pass through the hole at the center of the limiting aperture member 47. Due to the switching ON/OFF of the blankers, the blanking control is executed and ON/OFF of the multibeams 20 is controlled.

As described above, the limiting aperture member 47 shields the beams deflected by the blankers 24 and 26 to bring the multibeams 20 to an OFF state. Beams corresponding to one shot are formed of the multibeams 20 that have been formed from when the multibeams 20 are brought to an ON state until the multibeams 20 are brought to an OFF state and that have passed through the limiting aperture member 47.

The multibeams 20 having passed through the limiting aperture member 47 are focused by the objective lens 48 to which the optimum excitation amount, that is, a just focus is set in advance by the multibeam-focus adjusting method described later, into a pattern image reduced at a desired reduction ratio. The beams having passed through the limiting aperture member 47 (all the multibeams 20) are collectively deflected to the same direction by the second deflectors 49 and are irradiated to irradiation positions of the respective beams on the sample 62.

For example, while the XY stage 61 is continuously moved, the beams are controlled by the second deflectors 49 to cause the irradiation positions of the beams to follow the movement of the XY stage 61. The multibeams 20 irradiated at one time are ideally arrayed at a beam pitch obtained by multiplying the array pitch of the opening portions 43A of the aperture member 43 by the desired reduction ratio described above.

The charged-particle-beam lithography apparatus 1 performs the lithography operation by a raster scan method of continuously and sequentially irradiating shot beams. When a desired pattern is to be drawn, beams required for the pattern are controlled by the blanking control to be brought to an ON state.

(Multibeam-Focus Adjusting Method)

Figure 4:
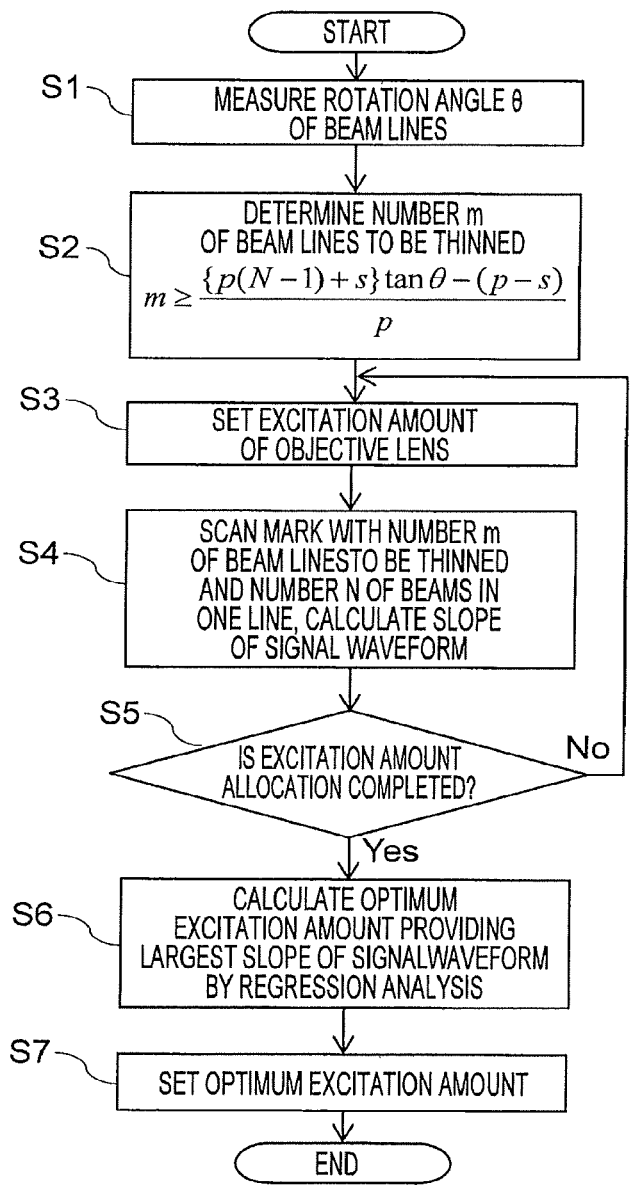
FIG. 4 is a flowchart illustrating the multibeam-focus adjusting method according to the first embodiment.

A multibeam-focus adjusting method according to the first embodiment, to which the charged-particle-beam lithography apparatus 1 illustrated in FIG. 1 is applied, is explained next. FIG. 4 is a flowchart illustrating the multibeam-focus adjusting method according to the first embodiment.

(S1: Measurement of Rotation Angle θ of Beam Lines 201)

First, as illustrated in FIG. 4, the rotation-angle acquiring part 31a measures a rotation angle θ of the beam lines 201 of the multibeams 20 with respect to the end edge 8a of the mark 8 provided on the XY stage 61 (Step S1).

Figure 5:
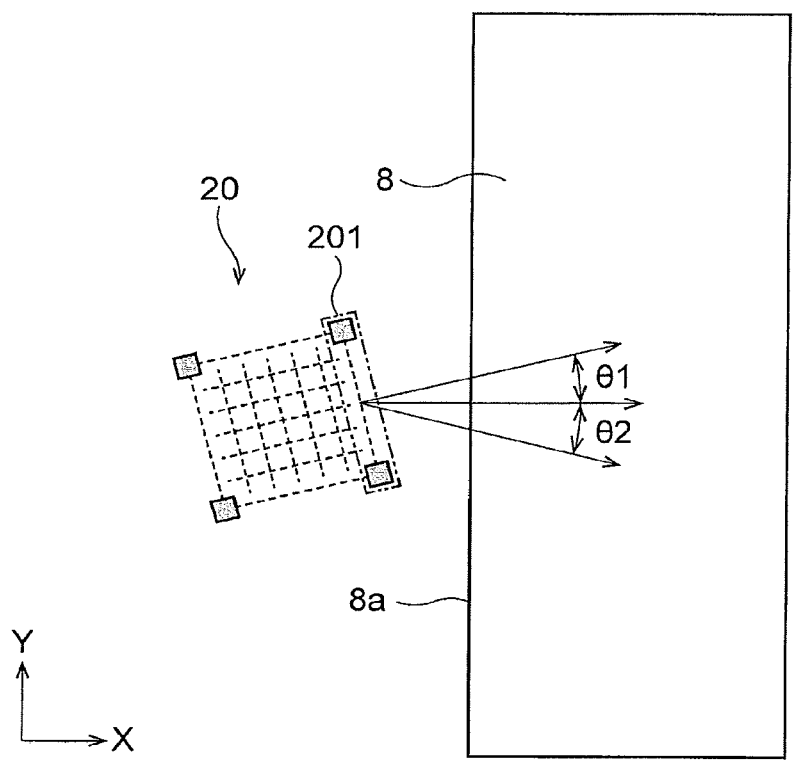
FIG. 5 is an explanatory diagram for explaining a measurement process of a rotation angle of beam lines in the multibeam-focus adjusting method according to the first embodiment.

FIG. 5 is an explanatory diagram for explaining a measurement process (Step S1) of the rotation angle θ of the beam lines 201 in the multibeam-focus adjusting method according to the first embodiment. For example, as illustrated in FIG. 5, the rotation-angle acquiring part 31a can set directions having a plurality of angles, such as angles of 0 [rad], θ1 [rad], and θ2[rad] with respect to the X direction, as the scan direction for the mark 8 and compare the waveforms of the electric signal output from the detector 7 when the mark 8 is scanned in the respective scan directions. The rotation-angle acquiring part 31a can acquire an angle of a time when the waveform of the electric signal becomes closest to a stepped shape (see a graph G1 in FIG. 6A) among the angles corresponding to the respective scan directions as the rotation angle θ of the beam lines 201.

(S2: Determination of the Number of Beam Lines 201 to be Thinned)

After the rotation angle θ of the beam lines 201 is measured, as illustrated in FIG. 4, the selection beam determiner 31b determines the number m of beam lines 201 to be thinned as an example of determination of selection beams in the multibeams 20 based on the acquired rotation angle θ (Step S2). The determination of the number m of beam lines 201 to be thinned is performed according to the following formula, for example.

$$m \geq \frac{\{p(N-1)+s\}\tan\theta - (p-s)}{p} \quad (1)$$

In the formula (1), m is number of beam lines 201 to be thinned, p is a beam pitch of the multibeams 20 described above, s is a beam size obtained by multiplying the size of the opening portions 43A by the reduction ratio described above, θ is a rotation angle of the beam lines 201, and N is number of beams per beam line 201 at a time when an S/N ratio required for focus adjustment is obtained. When N is too small, the amplitude of the waveform of the electric signal becomes too small and the electric signal and noise cannot be distinguished, which prevents the electric signal from being used for focus adjustment. Accordingly, in scanning, a sufficiently large number N of beams is secured per line to obtain an electric signal that can be clearly distinguished from noise.

For example, when the right-hand side of the formula (1) is 1, an overlap where illumination start periods for the mark 8 partially overlap between forward and backward beam lines 201 and 201 adjacent in the scan direction (see FIG. 6B) can be avoided by thinning one or more beam lines 201.

The selection beam determiner 31b can increase the number N of beams per beam line 201. For example, when the formula (1) has a negative value, the selection beam determiner 31b can increase the number N of beams in a range where m has a negative value, instead of thinning the beam lines 201. This enables to obtain a higher S/N ratio in a range where no overlap between the beam lines 201 occurs, and to enhance the accuracy of the adjustment.

(S3 to S7: Focus Adjustment)

After the number m of beam lines 201 to be thinned is determined, the focus adjuster 31c performs focus adjustment at following Steps S3 to S7 explained below. In the focus adjustment, the mark 8 is scanned with the multibeams 20 having the determined number of beams from a direction orthogonal to the end edge 8a of the mark 8 sequentially with each beam line, and the focus of the multibeams 20 is adjusted based on the reflected electrons acquired by the scan of the mark 8. This processing is explained specifically below.

In the focus adjustment, the focus adjuster 31c first sets an excitation amount of the objective lens 48, that is, an objective lens value via the lens control circuit 39 (Step S3). Setting of the excitation amount is achieved by excitation amount allocation in which a plurality of predetermined excitation amounts are sequentially set to the objective lens 48.

After the excitation amount of the objective lens 48 is set, the focus adjuster 31c executes control to scan the mark 8 with the multibeams 20 including the determined number m of beam lines 201 to be thinned and the number N of beams in each beam line 201, that is, with the selection beams in the set excitation amount (Step S4).

Figure 6A:
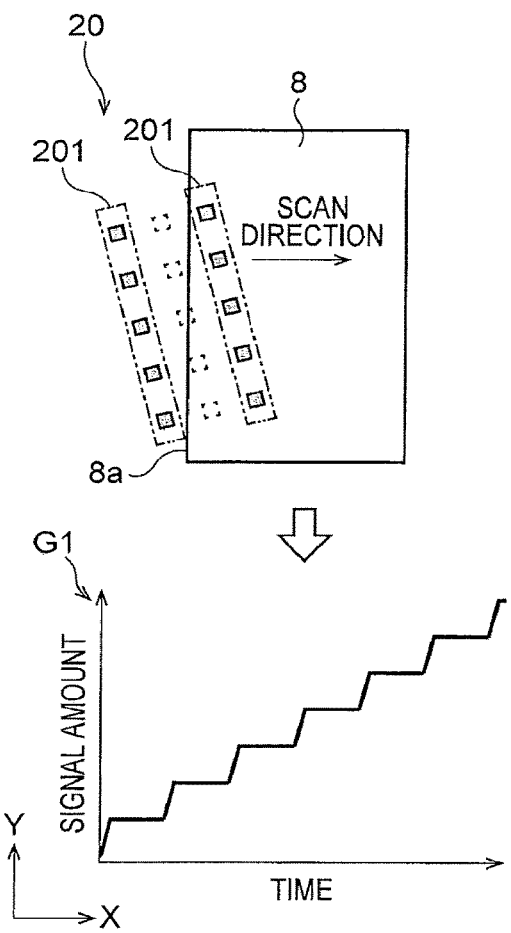
FIG. 6A is an explanatory diagram for explaining a scan process for a mark in the multibeam-focus adjusting method according to the first embodiment.
Figure 6B:
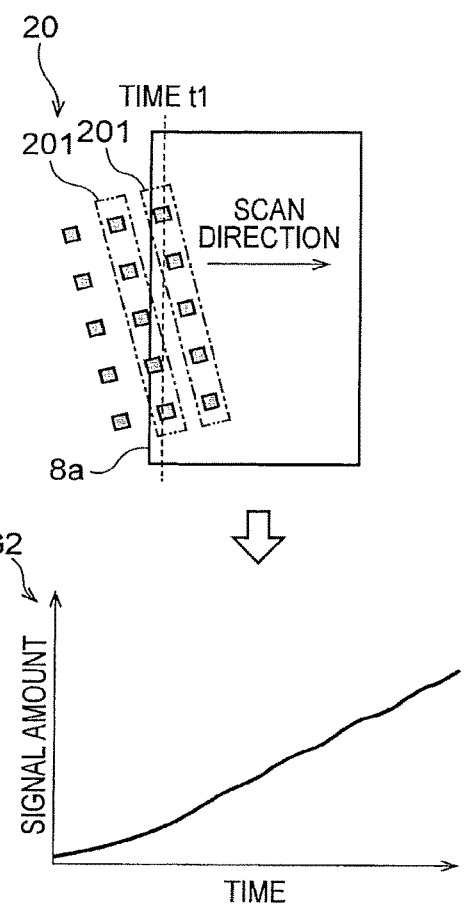
FIG. 6B is an explanatory diagram for explaining a scan process for a mark in a comparative example.

FIG. 6A is an explanatory diagram for explaining a scan process for a mark in the multibeam-focus adjusting method according to the first embodiment. FIG. 6B is an explanatory diagram for explaining a scan process for a mark in a comparative example.

With scan of the mark 8, the mark 8 emits reflected electrons. The detector 7 detects the reflected electrons emitted from the mark 8 and converts the detection result into an electric signal to be output. The graph G1 in FIG. 6A and a graph G2 in FIG. 6B indicate signal waveforms of the electric signal output from the detector 7 with scan of the mark 8, respectively. The horizontal axes in the graphs G1 and G2 represent the time and the vertical axes represent the signal amount of the electric signal. As indicated by the graphs G1 and G2, the signal amount output from the detector 7 increases as the scan progresses, that is, the time passes. This is because the total number of multibeams 20 entering the mark 8 increases as the scan progresses and the amount of emitted reflected electrons with respect to the incident multibeams 20 also increases.

On the aperture member 43, a plurality of opening portions 43A are arrayed in the Y direction to form one line of opening portions 43A and a plurality of lines of opening portions 43A are provided in the X direction (see FIG. 2). Accordingly, when the beam lines 201 of the multibeams 20 are not rotated with respect to the end edge 8a of the mark 8, one beam line 201 simultaneously enters the mark 8 along with the scan with the multibeams 20 in the X direction, and reflected electrons corresponding to one beam line 201 are simultaneously detected by the detector 7. Until the next beam line 201 enters the mark 8, the detection amount of reflected electrons hardly changes. Therefore, when the beam lines 201 are not rotated with respect to the end edge 8a of the mark 8, the waveform of the electric signal obtained by scanning the mark 8 becomes a stepped waveform that increases in a stepped manner as the time passes.

Meanwhile, in the both examples illustrated in FIGS. 6A and 6B, the beam lines 201 of the multibeams 20 are rotated with respect to the end edge 8a of the mark 8.

If the beam lines 201 of the multibeams 20 are not thinned out, an overlap occurs between forward and backward beam lines 201 and 201 adjacent in the scan direction where an irradiation start time t1 of a beam located at the tail end of the forward beam line 201 and an irradiation start time t1 of a beam located at the head of the backward beam line 201 overlap with each other as illustrated in FIG. 6B. Due to occurrence of an overlap, the waveform of the electric signal output from the detector 7 is rounded as indicated by the graph G2 in FIG. 6B.

In contrast thereto, in the first embodiment, the beam lines 201 are thinned out as illustrated in FIG. 6A. A thinned beam line is represented by a dashed line in FIG. 6A. Due to thinning of the beam lines 201, irradiation with a backward beam line 201 is started after irradiation of all beams in a forward beam line 201 is started. That is, no overlap occurs. Because no overlap occurs, the waveform of the electric signal output from the detector 7 becomes a stepped waveform that is rounded little as indicated by the graph G1 in FIG. 6A. Therefore, according to the first embodiment, by thinning out the beam lines 201, a signal waveform that can be used for focus adjustment can be reliably acquired even when the beam lines 201 are rotated with respect to the end edge 8a of the mark 8.

Figure 7:
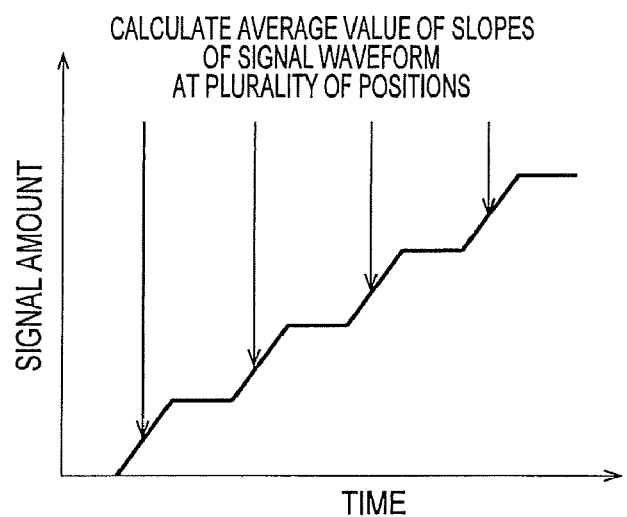
FIG. 7 is an explanatory diagram for explaining a calculation process of a slope of a signal waveform in the multibeam-focus adjusting method according to the first embodiment.

The focus adjuster 31c calculates the slope of the signal waveform of the electric signal based on the electric signal output from the detector 7 with scan of the mark 8 (Step S4). FIG. 7 is an explanatory diagram for explaining a calculation process of the slope of the signal waveform in the multibeam-focus adjusting method according to the first embodiment. As illustrated in FIG. 7, the focus adjuster 31c calculates, for example, an average value of slopes of the signal waveform at a plurality of positions as the slope of the signal waveform. Calculation of the average value of the slopes enables a correct slope in which an influence of a detection error such as noise is reduced to be acquired.

After the slope of the signal waveform of the electric signal is calculated, as illustrated in FIG. 4, the focus adjuster 31c determines whether the excitation amount allocation is completed (Step S5).

When the excitation amount allocation is completed (YES at Step S5), the focus adjuster 31c calculates an optimum excitation amount that provides the largest slope of the signal waveform by a regression analysis (Step S6). On the other hand, when the excitation amount allocation is not completed (NO at Step S5), the focus adjuster 31c continues the excitation amount allocation and sets a new excitation amount (Step S3).

Figure 8:
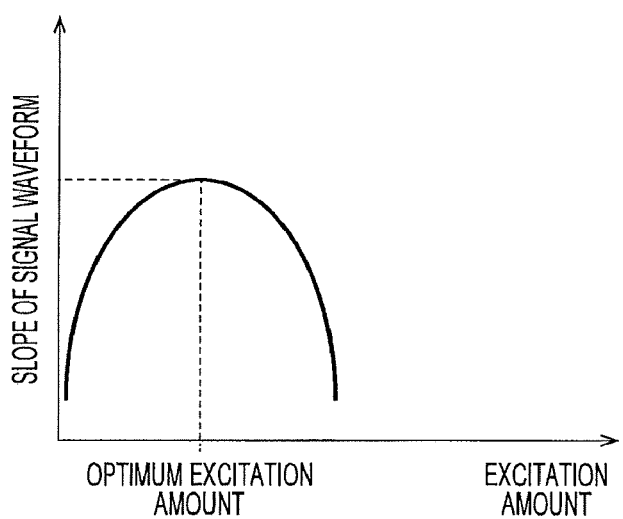
FIG. 8 is an explanatory diagram for explaining a calculation process of an excitation amount of an objective lens at a time when the slope of the signal waveform becomes largest in the multibeam-focus adjusting method according to the first embodiment.

FIG. 8 is an explanatory diagram for explaining the calculation process of the excitation amount of the objective lens 28 at a time when the slope of the signal waveform becomes largest in the multibeam-focus adjusting method according to the first embodiment. In calculating the optimum excitation amount, the focus adjuster 31c calculates a function of the excitation amount and the slope while representing the excitation amount on the horizontal axis and the slope of the signal waveform on the vertical axis as illustrated in FIG. 8. FIG. 8 illustrates a quadratic function as an example. The focus adjuster 31c sets an excitation amount corresponding to the maximum value of the function as a calculation result of the optimum excitation amount.

After calculating the optimum excitation amount, the focus adjuster 31c sets the optimum excitation amount as the focus of the multibeams 20 at the time of lithography of the pattern as illustrated in FIG. 4 (Step S7).

As described above, according to the first embodiment, the beam lines 201 are thinned out according to the rotation angle of the beam lines 201 with respect to the end edge 8a of the mark 8, so that the signal waveform of the reflected electrons in which rounding caused by an overlap is suppressed can be obtained. Accordingly, the focus of the multibeams can be adjusted appropriately.

Second Embodiment

A multibeam-focus measurement method according to a second embodiment is explained next. In the first embodiment, the optimum excitation amount of the objective lens 48, that is, one focus at a time when a pattern is drawn on the sample 62 is calculated.

In contrast thereto, in the second embodiment, to acquire variations of the focus corresponding to the beam irradiation positions, the plural lines of the opening portions 43A of the aperture member 43 are divided into groups of opening portions and the focus of multibeams is measured with respect to each group of opening portions. The second embodiment is explained specifically below. In the second embodiment, constituent elements corresponding to those of the first embodiment are denoted by like reference characters and redundant explanations thereof are omitted.

Figure 9:
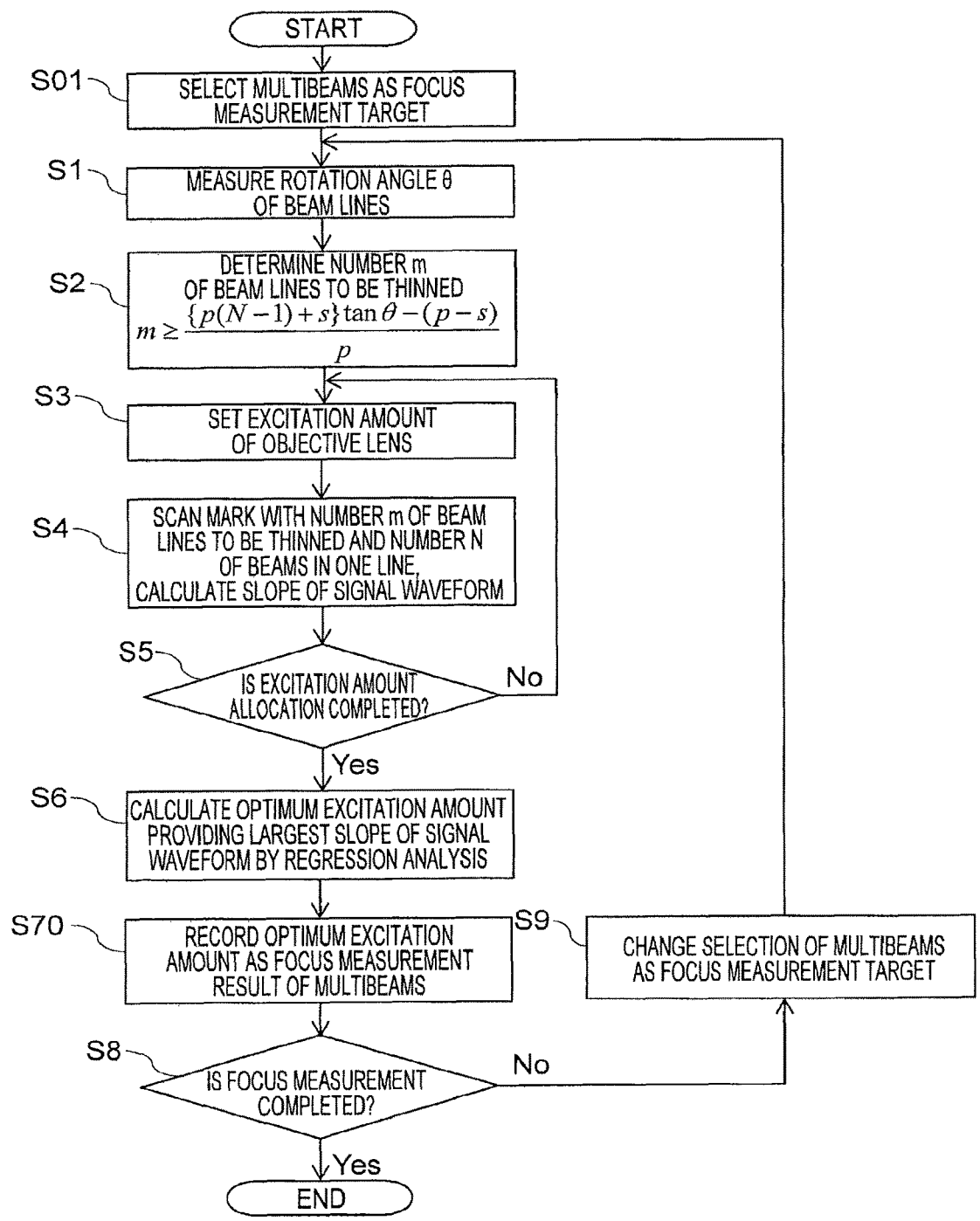
FIG. 9 is a flowchart illustrating a multibeam-focus measurement method according to a second embodiment.

FIG. 9 is a flowchart illustrating the multibeam-focus measurement method according to the second embodiment. In the second embodiment, first, the rotation-angle acquiring part 31a previously selects ones of multibeams 20 as a focus measurement target before the multibeams 20 are generated (Step S01).

Figure 10A:
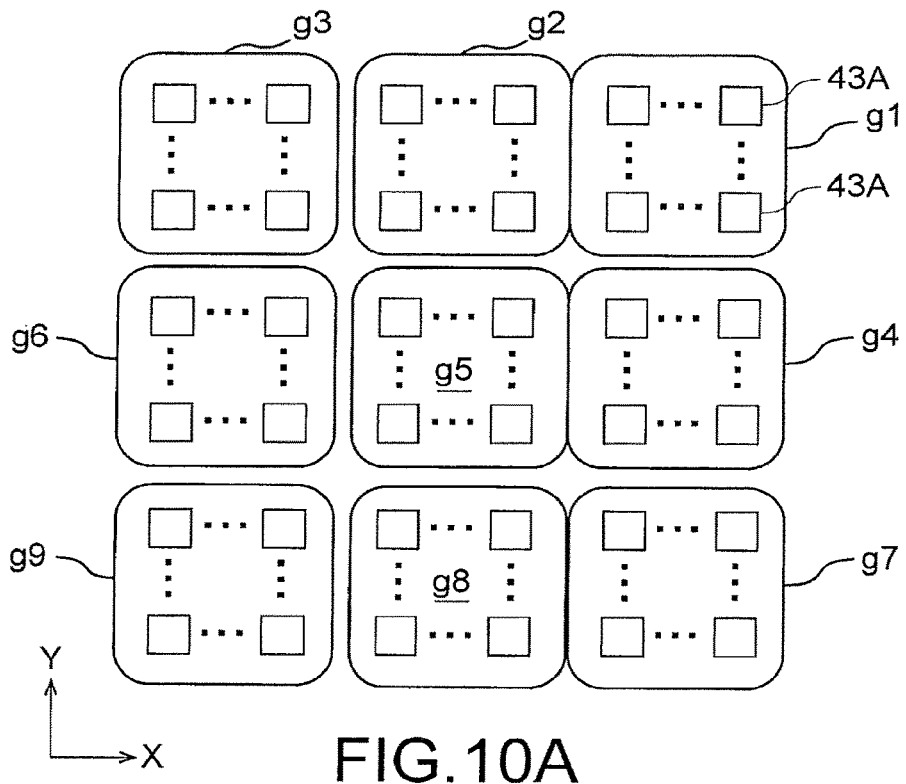
FIG. 10A is an explanatory diagram for explaining opening portion groups of the aperture member to be used in the multibeam-focus measuring method according to the second embodiment.

FIG. 10A is an explanatory diagram for explaining opening portion groups g of the aperture member 43 to be used in the multibeam-focus measuring method according to the second embodiment. FIG. 10A illustrates a plurality of opening portion groups g1 to g9. Multibeams 20 irradiated through each of the opening portion groups g1 to g9 are a unit of a focus measurement target. Each of the opening portion groups g1 to g9 is constituted of a plurality of opening portions 43A in the X direction and a plurality of opening portions 43A in the Y direction. The numbers of the opening portions 43A included in the respective opening portion groups g1 to g9 can be equal or different. Selecting multibeams 20 as a focus measurement target (Step S01) is, in other words, designating blankers 24 and 26 through which multibeams 20 other than the multibeams 20 being the focus measurement target pass, as a target of blanking deflection.

After the multibeams 20 as the focus measurement target are selected, the measurement of the rotation angle θ (Step S1), the determination of the number m of beam lines 201 to be thinned (Step S2), and the calculation of the optimum excitation amount along with the excitation amount allocation (Steps S3 to S6) are performed for the target of the selected multibeams 20 similarly in the first embodiment.

After the optimum excitation amount is calculated, the focus adjuster 31c records the calculated optimum excitation amount as a focus measurement result of the multibeams 20 (Step S70). At that time, the focus adjuster 31c can record the optimum excitation amount to be associated with corresponding XY coordinates.

After the focus measurement result is recorded, the focus adjuster 31c determines whether focus measurement of multibeams 20 in units of the opening portion groups g1 to g9 is completed (Step S8).

When the focus measurement is completed (YES at Step S8), the focus adjuster 31c ends the processing. When the focus measurement is not completed (NO at Step S8), the focus adjuster 31c changes selection of the multibeams 20 being the focus measurement target (Step S9). After the selection is changed, the processing at Step S1 and subsequent steps is performed for the changed multibeams 20.

Figure 10B:
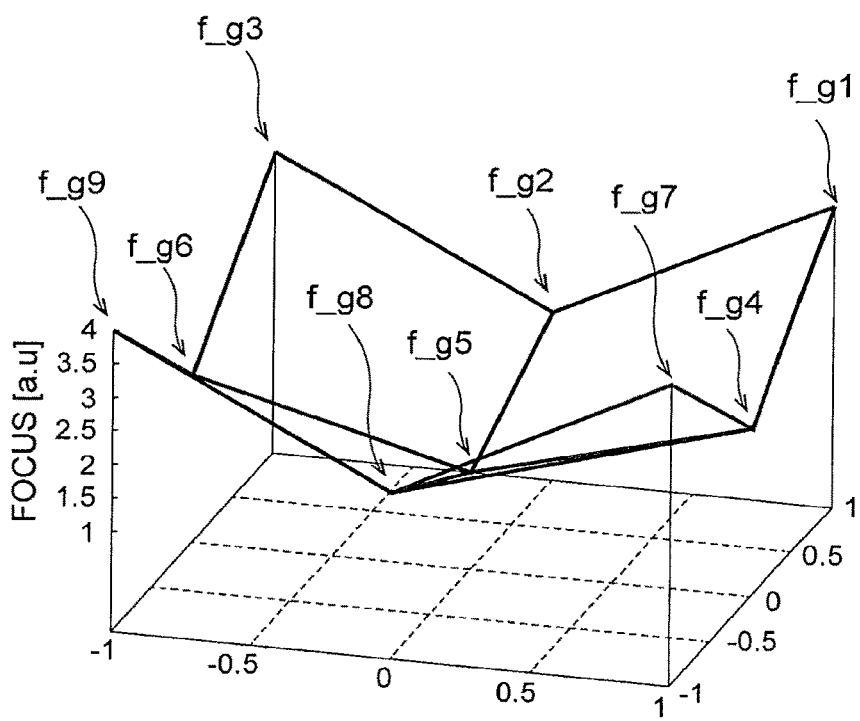
FIG. 10B illustrates a field curvature obtained by focus measurement with respect to each of the opening portion groups.

FIG. 10B illustrates a field curvature obtained by the focus measurement with respect to each of the opening portion groups g1 to g9. FIG. 10B illustrates focuses corresponding to the opening portion groups g1 to g9 illustrated in FIG. 10A, denoted by signs of the corresponding opening portion groups added with "f_", respectively. For example, the focus corresponding to the opening portion group g1 is denoted by f_g1.

As illustrated in FIG. 10B, the field curvature can be obtained by performing the focus measurement for a target of the multibeams 20 with respect to each of the opening portion groups g1 to g9. The obtained field curvature can be used to adjust a lithography condition of the charged-particle-beam lithography apparatus 1 so as to correct the field curvature. With the correction of the field curvature, the linewidth dimension accuracy can be improved.

As described above, according to the second embodiment, the beam lines 201 are thinned out with respect to each of the opening portion groups g1 to g9 according to the rotation angle of the beam lines 201 in each of the opening portion groups g1 to g9, whereby the signal waveform of reflected electrons where rounding caused by an overlap is suppressed can be obtained with respect to each of the opening portion groups g1 to g9. Accordingly, adjustment of the focus of multibeams and acquisition of the adjusted focus, that is, focus measurement can be appropriately performed with respect to each of the opening portion groups g1 to g9.

The embodiments described above have been presented by way of example only and is not intended to limit the scope of the invention. The embodiments can be implemented in a variety of other forms, and various omissions, substitutions and changes can be made without departing from the spirit of the invention. The embodiments and modifications thereof are included in the scope of invention described in the claims and their equivalents as well as the scope and the spirit of the invention.

The invention claimed is:

1. A multibeam-focus adjusting method in a charged-particle-beam lithography apparatus that draws a pattern by irradiating a sample with multibeams having a plurality of beam lines, each beam line being composed of a plurality of beams and the beam lines being formed through a plurality of lines of opening portions, each line of the opening portions being composed of a plurality of opening portions respectively and the opening portions being provided on an aperture member, the method adjusting a focus of the multibeams and comprising:

acquiring a rotation angle of the beam lines with respect to an end edge of a mark provided at a predetermined position;

determining a plurality of beams to be used for adjustment among a plurality of beams composing one beam line out of the beam lines based on the acquired rotation angle; and adjusting a focus of the multibeams based on an electric signal detected by reflected electrons acquired by irradiating the mark with the determined beams and scanning the mark in a direction orthogonal to the end edge of the mark, wherein, in determining the beams, a number of the beams is obtained such that a signal-to-noise ratio of the electric signal becomes the signal-to-noise ratio required for adjusting the focus, and wherein a number of the beam lines to be thinned is obtained by a following formula (1):

$$m \geq \frac{\{p(N-1)+s\}\tan\theta - (p-s)}{p} \quad (1)$$

where m is a number of beam lines to be thinned, p is a beam pitch of multibeams, s is a beam size, θ is a rotation angle of the beam lines, and N is a number of beams per beam line in the formula (1).

2. The method of claim 1, wherein determining the beams comprises determining the number of the beam lines to be thinned.

3. The method of claim 1, wherein a value of N is increased when m has a negative value.

4. The method of claim 1, wherein adjustment of the focus comprises:

setting a plurality of excitation amounts to an objective lens;

acquiring an electric signal of the reflected electrons by scanning the mark with the determined beams in each of the set excitation amounts; and setting an excitation amount providing a largest slope of a signal waveform of the electrical signal among the excitation amounts as a focus of the multibeams.

5. The method of claim 4, wherein the signal waveform is a stepped waveform indicating a signal amount increasing in a stepped manner as time passes.

6. The method of claim 5, wherein a slope of the signal waveform is an average value of slopes of the signal waveform at a plurality of positions.

7. A multibeam-focus calculation method in a charged-particle-beam lithography apparatus that draws a pattern by irradiating a sample with multibeams having a plurality of beam groups, each beam group having a plurality of beam lines, each beam line being composed of a plurality of beams and the beam groups being formed through opening portion groups, each opening portion group having a plurality of lines of opening portions, each line of the opening portions being composed of a plurality of opening portions respectively and the opening portion groups provided for each area of an aperture member, the method calculating a focus of the multibeams and comprising:

acquiring a rotation angle formed by the beam lines with respect to an end edge of a mark provided at a predetermined position;

determining a plurality of beams to be used for calculation among a plurality of beams composing one beam line out of the beam lines based on the acquired rotation angle;

detecting an electric signal of reflected electrons, the reflected electrons acquired by adjusting an excitation amount of an objective lens;

irradiating the mark with the determined beams;

scanning the mark in a direction orthogonal to the end edge of the mark; and calculating an optimized excitation amount that focuses the multibeams to a sample surface, wherein a number of the beam lines to be thinned is obtained by a following formula (1):

$$m \geq \frac{\{p(N-1)+s\}\tan\theta - (p-s)}{p} \quad (1)$$

where in is a number of beam lines to be thinned, p is a beam pitch of multibeams, s is a beam size, θ is a rotation angle of the beam lines, and N is a number of beams per beam line in the formula (1).

8. The method of claim 7, wherein the calculating the optimized excitation amount is performed to acquire a field curvature of each of the opening portion groups.

9. A charged-particle-beam lithography apparatus that draws a pattern by irradiating a sample with multibeams having a plurality of beam lines, each beam line being composed of a plurality of beams and the beam lines being formed through a plurality of lines of opening portions, each line of the opening portions being composed of a plurality of opening portions respectively and the opening portions provided on an aperture member, the apparatus comprising a controller adjusting a focus of the multibeams, wherein the controller acquires a rotation angle of the beam lines with respect to an end edge of a mark provided at a predetermined position, determines a plurality of beams to be used for adjustment among a plurality of beams composing one beam line out of the beam lines based on the acquired rotation angle, and adjusts a focus of the multibeams based on an electric signal detected by reflected electrons acquired by irradiating the mark with the determined beams and scanning the mark in a direction orthogonal to the end edge of the mark, wherein, in determining the beams, a number of the beams is obtained such that a signal-to-noise ratio of the electric signal becomes the signal-to-noise ratio required for adjusting the focus, and wherein a number of the beam lines to be thinned is obtained by a following formula (1):

$$m \geq \frac{\{p(N-1)+s\}\tan\theta - (p-s)}{p} \quad (1)$$

where m is a number of beam lines to be thinned, p is a beam pitch of multibeams, s is a beam size, θ is a rotation angle of the beam lines, and N is a number of beams per beam line in the formula (1).

10. The apparatus of claim 9, wherein determining the beams comprises determining the number of the beam lines to be thinned.

11. The apparatus of claim 9, wherein a value of N is increased when m has a negative value.

12. The apparatus of claim 9, wherein the controller, in adjustment of a focus of the multibeams,
   sets a plurality of excitation amounts to an objective lens,
   acquires an electric signal of the reflected electrons by scanning the mark with the determined beams in each of the set excitation amounts, and
   sets an excitation amount providing a largest slope of a signal waveform of the electric signal among the excitation amounts as a focus of the multibeams.

13. The apparatus of claim 12, wherein the signal waveform is a stepped waveform indicating a signal amount increasing in a stepped manner as time passes.

14. The apparatus of claim 13, wherein a slope of the signal waveform is an average value of slopes of the signal waveform at a plurality of positions.

* * * * *